(12) United States Patent
Wang

(10) Patent No.: US 10,192,496 B2
(45) Date of Patent: Jan. 29, 2019

(54) ANGLE CUTTING MODULATING CIRCUIT AND LIQUID CRYSTAL DISPLAY DEVICE HAVING THE ANGLE CUTTING MODULATING CIRCUIT

(71) Applicant: Shenzhen China Star Optoelectronics Technology Co., Ltd., Shenzhen, Guangdong (CN)

(72) Inventor: Zhao Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 293 days.

(21) Appl. No.: 15/116,927

(22) PCT Filed: May 24, 2016

(86) PCT No.: PCT/CN2016/083076
§ 371 (c)(1),
(2) Date: Aug. 5, 2016

(87) PCT Pub. No.: WO2017/185437
PCT Pub. Date: Nov. 2, 2017

(65) Prior Publication Data
US 2018/0182312 A1    Jun. 28, 2018

(30) Foreign Application Priority Data
Apr. 26, 2016    (CN) .......................... 2016 1 0265382

(51) Int. Cl.
*G09G 3/36*    (2006.01)
*H03K 5/01*    (2006.01)
(Continued)

(52) U.S. Cl.
CPC ............. *G09G 3/36* (2013.01); *G02F 1/1368* (2013.01); *H03K 5/01* (2013.01); *H03K 17/687* (2013.01); *G09G 2310/06* (2013.01)

(58) Field of Classification Search
CPC .... G02F 1/1368; G09G 2310/06; G09G 3/36; G09G 3/3696; G09G 2310/066; G09G 2310/067; H03K 17/687; H03K 5/01
See application file for complete search history.

(56) References Cited

U.S. PATENT DOCUMENTS 9,135,879 B2    9/2015 Chen
2004/0246245 A1    12/2004 Yanagi
(Continued)

FOREIGN PATENT DOCUMENTS

CN    101739974 A    6/2010
CN    102136259 A    7/2011
(Continued)

*Primary Examiner* — Hong Zhou
(74) *Attorney, Agent, or Firm* — Andrew C. Cheng

(57) ABSTRACT

The present application discloses a liquid crystal display device having an angle cutting modulating circuit, wherein the liquid crystal display device includes an angle cutting modulating circuit and a thin-film transistor, the angle cutting modulating circuit includes a first modulating circuit and a second modulating circuit, wherein the angle cutting modulating circuit is used to select to open one of the first modulating circuit or the second modulating circuit to realize the modulating of the resistance of the angle cutting resistor when switching modes of the liquid crystal display device to optimize the angle cutting of the gate voltages provided to the thin film transistor in different display modes by the angle cutting modulating circuit. The present application also discloses an angle cutting modulating circuit.

5 Claims, 3 Drawing Sheets

(51) Int. Cl.
*H03K 17/687* (2006.01)
*G02F 1/1368* (2006.01)

(56) References Cited

U.S. PATENT DOCUMENTS

| | | | | |
|---|---|---|---|---|
| 2010/0123703 | A1* | 5/2010 | Guo | G09G 3/3648 345/211 |
| 2010/0245333 | A1* | 9/2010 | Hsu | G09G 3/3648 345/213 |
| 2011/0084894 | A1* | 4/2011 | Siao | G09G 3/20 345/55 |
| 2012/0038610 | A1* | 2/2012 | Li | G09G 3/3696 345/211 |
| 2012/0169695 | A1* | 7/2012 | Chang | G09G 3/3648 345/211 |
| 2013/0044085 | A1* | 2/2013 | Lin | G09G 3/3677 345/204 |
| 2013/0107152 | A1* | 5/2013 | Okumura | G09G 3/3677 349/41 |

FOREIGN PATENT DOCUMENTS

| | | |
|---|---|---|
| CN | 102237061 A | 11/2011 |
| CN | 102280094 A | 12/2011 |
| CN | 102314846 A | 1/2012 |
| CN | 102622987 A | 8/2012 |
| CN | 102956215 A | 3/2013 |
| CN | 103247280 A | 8/2013 |
| CN | 105489151 A | 4/2016 |

\* cited by examiner

ANGLE CUTTING MODULATING CIRCUIT AND LIQUID CRYSTAL DISPLAY DEVICE HAVING THE ANGLE CUTTING MODULATING CIRCUIT

FIELD OF THE INVENTION

The present application relates to a display driving technology field, and more particularly to an angle cutting modulating circuit and a liquid crystal display device with the angle cutting modulating circuit.

BACKGROUND OF THE INVENTION

In order to optimize the performance of the liquid crystal display in the design of the existing driving circuits, the angle cutting function is added to achieve more uniformly display in the horizontal direction. Its working principle is: by the timing signal to control the thin film transistor-liquid crystal display, TFT-LCD and open the output terminal of the angle cutting voltage VGH to operate discharging, so that the waveform of the opened output terminal of the angle cutting voltage VGH that actually control the TFT-LCD is changed from constant voltage to a periodic sloping falling voltage.

As illustrated in FIG. 1, the structure in FIG. 1 is usually adapted in the conventional angle cutting circuit. By controlling the waveform of the square wave GVON and the resistance of the angle cutting resistor R, the waveform of the output terminal of angle cutting voltage VGH can be changed to achieve optimization purposes of the display. In the meantime, referring to FIG. 2, FIG. 2 is a waveform diagram illustrating the square wave GVON and the angle cutting resistor R. When the square wave GVON is in low electrical level, the constant voltage input by the input terminal VGHF is discharged, and the waveform becomes gate shaped VGH waveform wherein the time of the angle cutting can be decided by the time of the square wave GVON is in low electrical level, the rate of the angle cutting can be decided by the resistance of the angle cutting resistor R.

Since the difference of the operating modes of the liquid crystal display, the need of the best angle cutting waveform can be different. In other modes, such as the 3D functionality mode, the time of the angle cutting can be changed by controlling the variation of the waveform of the square wave output from the terminal of the sequence controlling T-con. But the angle cutting resistor R that influence the angle cutting rate cannot be adjusted, resulting in the best angle cutting waveform cannot be obtained in other modes.

SUMMARY OF THE INVENTION

In other to solve the insufficient of the conventional technology, the present application provides an angle cutting modulating circuit and a liquid crystal display device having an angle cutting modulating circuit to change the rate of the angle cutting by time according to the different operation modes of the liquid crystal display device.

The purpose of the present application is achieved by the following approach: a liquid crystal display device having an angle cutting modulating circuit, wherein the liquid crystal display device includes an angle cutting modulating circuit and a thin-film transistor, the angle cutting modulating circuit includes a first modulating circuit and a second modulating circuit, wherein the angle cutting modulating circuit is used to select to open one of the first modulating circuit or the second modulating circuit to realize the modulating of the resistance of the angle cutting resistor when switching modes of the liquid crystal display device to optimize the angle cutting of the gate voltages provided to the thin film transistor in different display modes by the angle cutting modulating circuit.

The angle cutting modulating circuit includes the angle cutting resistor, a first resistor, a second resistor, a third resistor connected to the second resistor, a fourth resistor connected to the third transistor, a fifth resistor, a first field effect transistor and a second field effect transistor, wherein the second resistor forms the first modulating circuit, the third resistor, the fourth resistor, the fifth resistor and the second field effect transistor jointly form the second modulating circuit, the first resistor is separately connected to the first modulating circuit and the second modulating circuit by the first field effect transistor.

One terminal of the angle cutting resistor and one terminal of the first resistor are connected to the control terminal, the other terminal of the first resistor is connected to the source electrode of the first field effect transistor, the gate electrode of the first field effect transistor is connected to one terminal of the second resistor and one terminal of the third resistor.

The other terminal of the third resistor is connected to one terminal of the fourth resistor and the source electrode of the second field effect transistor, the gate electrode of the second field effect transistor is connected to one terminal of the fifth resistor, the other terminal of the second resistor and the other terminal of the fifth resistor are jointly connected to the enable control terminal.

The other terminal of the fourth resistor is connected to the power source terminal, the other terminal of the angle cutting resistor, the drain electrode of the first field effect transistor and the drain electrode of the second field effect transistor are ground.

The first field effect transistor and the second field effect transistor are N-type field effect transistor When the resistance of the angle cutting resistor in the normal mode is larger than the resistance of the angle cutting resistor in other modes, the first modulating circuit is selected to open and the second modulating circuit is not opened.

When the resistance of the angle cutting resistor in the normal mode is smaller than the resistance of the angle cutting resistor in other modes, the second modulating circuit is selected to open and the first modulating circuit is not opened.

An angle cutting modulating circuit includes an angle cutting resistor, a first resistor parallel connected the angle cutting resistor and can be selectively join the circuit, a second resistor, a third resistor connected to the second resistor, a fourth resistor connected to the third transistor, a fifth resistor, a first field effect transistor and a second field effect transistor, wherein the second resistor forms the first modulating circuit, the third resistor, the fourth resistor, the fifth resistor and the second field effect transistor jointly form the second modulating circuit, the first resistor is separately connected to the first modulating circuit and the second modulating circuit by the first field effect transistor, wherein the angle cutting modulating circuit is used to select to open one of the first modulating circuit or the second modulating circuit to realize the modulating of the resistance of the angle cutting resistor.

The advantage of the present application is to change the rate of the angle cutting by time according to the different operation modes of the liquid crystal display device to achieve the function of optimizing the angle cutting in different modes.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
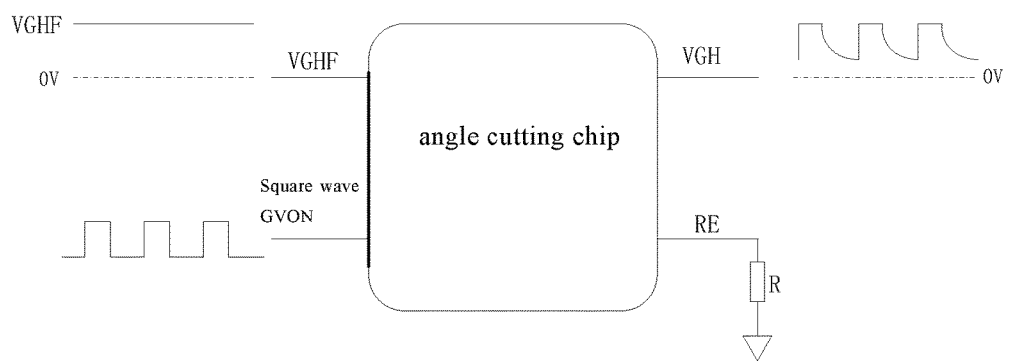
FIG. 1 is the conventional angle cutting circuit.
Figure 2:
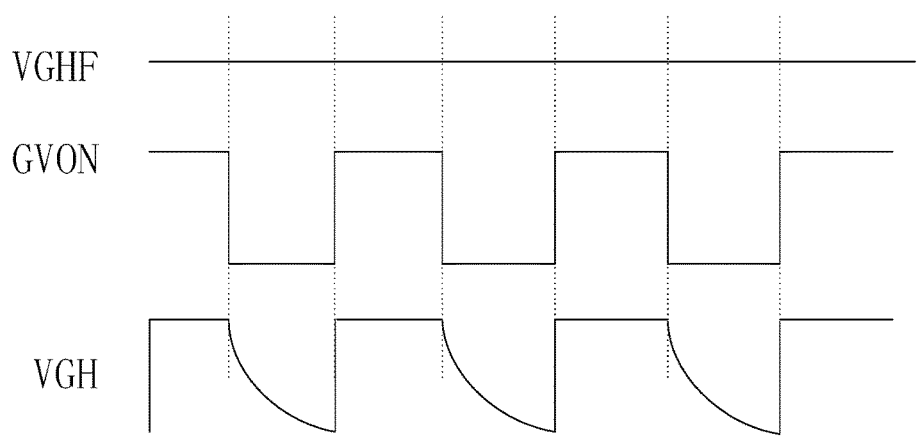
FIG. 2 is a schematic waveform diagram illustrating the square wave GVON and the angle cutting resistor R.
Figure 3:
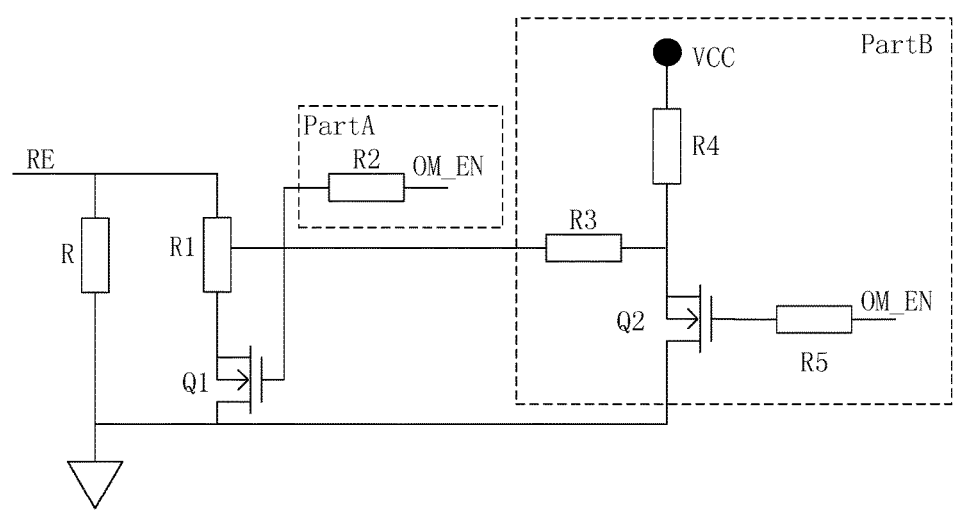
FIG. 3 is a schematic circuit diagram of the angle cutting modulating circuit and the liquid crystal display device with the angle cutting modulating circuit of the present application.

Referring to FIG. 3, FIG. 3 is a schematic circuit diagram of the angle cutting modulating circuit and the liquid crystal display device with angle cutting modulating circuit of the present application. The angle cutting modulating circuit includes an angle cutting resistor R, a first resistor R1, a second resistor R2, a third resistor R3, a fourth resistor R4, a fifth resistor R5, a first field effect transistor Q1 and a second field effect transistor Q2. Wherein the second resistor R2 forms a first modulating circuit PartA, the third resistor R3, the fourth resistor R4, the fifth resistor R5 and the second field effect transistor Q2 jointly form a second modulating circuit PartB.

One terminal of the angle cutting resistor R and one terminal of the first resistor R1 are connected to the control terminal RE. The other terminal of the first resistor R1 is connected to the source electrode of the first field effect transistor Q1. The gate electrode of the first field effect transistor Q1 is connected to one terminal of the second resistor R2 and one terminal of the third resistor R3. The other terminal of the third resistor R3 is connected to one terminal of the fourth resistor R4 and the source electrode of the second field effect transistor Q2. The gate electrode of the second field effect transistor Q2 is connected to one terminal of the fifth resistor R5. The other terminal of the second resistor R2 and the other terminal of the fifth resistor R5 are jointly connected to the enable control terminal OM_EN. The other terminal of the fourth resistor R4 is connected to the power source terminal VCC. The other terminal of the angle cutting resistor R, the drain electrode of the first field effect transistor Q1 and the drain electrode of the second field effect transistor Q2 are ground.

Wherein, in the present application, the first field effect transistor Q1 and the second field effect transistor Q2 are N-type field effect transistor. In other embodiments, the first field effect transistor Q1 and the second field effect transistor Q2 can be other switching elements to achieve the same function.

The working principle of the liquid crystal display device with angle cutting modulating circuit of the present application is as follows:

When the resistance of the angle cutting resistor R in the normal mode is larger than the resistance of the angle cutting resistor R in other modes, the first modulating circuit PartA is selected to open and the second modulating circuit PartB is not opened. In this case, in the normal mode, the enable control terminal OM_EN is in low electrically level, the first field effect transistor Q1 is turned off, the actual resistance of the angle cutting resistor connected into the circuit is R. When switching to another modes, the enable control terminal OM_EN is in high electrically level, the first field effect transistor Q1 is turned on, the first resistor R1 is added to the circuit and parallel connected to the angle cutting resistor R, the actual resistance of the angle cutting resistor connected into the circuit is R/R1 and its value is less than R, thus realizing reduction the resistance of the angle cutting resistor. By adjusting the resistance of the angle cutting resistor R and the resistance of the first resistor R1 can realize the optimization of the resistance of the angle cutting resistor in the two modes.

When the resistance of the angle cutting resistor R in the normal mode is smaller than the resistance of the angle cutting resistor R in other modes, the second modulating circuit PartB is selected to open and the first modulating circuit PartA is not opened. In this case, in the normal mode, the enable control terminal OM_EN is in low electrically level, the second field effect transistor Q2 is turned off, the gate electrode of the first field effect transistor Q1 is pull up and the first field effect transistor Q1 is turn on, the actual resistance of the angle cutting resistor connected into the circuit is R/R1. When switching to another modes, the enable control terminal OM_EN is in high electrically level, the second field effect transistor Q2 is turned on, the gate electrode of the first field effect transistor Q1 is pull down, the first field effect transistor Q1 is turn off, the actual resistance of the angle cutting resistor connected into the circuit is R and its value is more than R, thus realizing addition the resistance of the angle cutting resistor. By adjusting the resistance of the angle cutting resistor R and the resistance of the first resistor R1 can realize the optimization of the resistance of the angle cutting resistor in the two modes.

The liquid crystal display device with the angle cutting modulating circuit of the present application has an angle cutting resistor R and to selectively parallel connected the first resistor R1 in the circuit. The selectively added of the first resistor R1 is realized by adding the control of the enable control terminal OM_EN.

Whether the resistance of the angle cutting resistor needed in the normal mode or the other modes is the same or not, the switch can be achieved. Therefor the optimization of the angle cutting can be achieved in different modes.

Above are embodiments of the present application, which does not limit the scope of the present application. Any modifications, equivalent replacements or improvements within the spirit and principles of the embodiment described above should be covered by the protected scope of the invention.

What is claimed is:

1. A liquid crystal display device having an angle cutting modulating circuit, wherein the liquid crystal display device comprises an angle cutting modulating circuit and a thin-film transistor, the angle cutting modulating circuit comprises a first modulating circuit and a second modulating circuit, wherein the angle cutting modulating circuit is used to select to open one of the first modulating circuit and the second modulating circuit to realize modulating of a resistance of an angle cutting resistor when switching is conducted among modes of the liquid crystal display device to optimize the angle cutting of gate voltages provided to a thin film transistor in different ones of the modes by the angle cutting modulating circuit;

wherein the angle cutting modulating circuit comprises the angle cutting resistor, a first resistor, a second resistor, a third resistor connected to the second resistor, a fourth resistor connected to the third transistor, a fifth resistor, a first field effect transistor and a second field effect transistor, wherein the second resistor forms the first modulating circuit; and the third resistor, the fourth resistor, the fifth resistor and the second field effect transistor jointly form the second modulating circuit, wherein the first resistor is connected to the first modulating circuit and the second modulating circuit by the first field effect transistor.

2. The liquid crystal display device having an angle cutting modulating circuit according to claim 1, wherein one terminal of the angle cutting resistor and one terminal of the first resistor are connected to a control terminal, the other terminal of the first resistor is connected to a source electrode of the first field effect transistor, and a gate electrode of the first field effect transistor is connected to one terminal of the second resistor and one terminal of the third resistor.

3. The liquid crystal display device having an angle cutting modulating circuit according to claim 2, wherein the other terminal of the third resistor is connected to on terminal of the fourth resistor and a source electrode of the second field effect transistor, a gate electrode of the second field effect transistor is connected to one terminal of the fifth resistor, and the other terminal of the second resistor and the other terminal of the fifth resistor are jointly connected to an enable control terminal.

4. The liquid crystal display device having an angle cutting modulating circuit according to claim 3, wherein the other terminal of the fourth resistor is connected to a power source terminal, and the other terminal of the angle cutting resistor, a drain electrode of the first field effect transistor and the drain electrode of the second field effect transistor are ground.

5. The liquid crystal display device having an angle cutting modulating circuit according to claim 1, wherein when the resistance of the angle cutting resistor in a normal mode is larger than the resistance of the angle cutting resistor in other modes, the first modulating circuit is selected to open and the second modulating circuit is not opened; when the resistance of the angle cutting resistor in the normal mode is smaller than the resistance of the angle cutting resistor in other modes, the second modulating circuit is selected to open and the first modulating circuit is not opened.

* * * * *